United States Patent [19]

Balaban et al.

[11] 4,216,396
[45] Aug. 5, 1980

[54] SAMPLE-HOLD PHASE DETECTOR

[75] Inventors: Alvin R. Balaban, Lebanon; Steven A. Steckler, Clark, both of N.J.

[73] Assignee: RCA Corporation, New York, N.Y.

[21] Appl. No.: 936,408

[22] Filed: Aug. 24, 1978

[51] Int. Cl.² ........................................... G11C 27/02
[52] U.S. Cl. ................................. 307/353; 307/232; 328/133; 328/151; 358/158
[58] Field of Search ................... 307/232, 353, 352; 328/133, 151; 358/158

[56] References Cited
U.S. PATENT DOCUMENTS

| | | | |
|---|---|---|---|
| 3,641,258 | 2/1972 | Steckler | 328/133 X |
| 3,671,783 | 6/1972 | Hampel et al. | 307/353 X |
| 3,870,900 | 3/1975 | Malaviya | 328/133 X |
| 3,961,360 | 6/1976 | Sato et al. | 328/133 X |

Primary Examiner—John Zazworsky
Attorney, Agent, or Firm—P. J. Rasmussen; W. H. Meagher; W. B. Yorks, Jr.

[57] ABSTRACT

A differential sample-and-hold circuit includes first and second emitter-coupled transistors the bases of which are coupled to the signal source to be sampled. A gated circuit source coupled to the joined emitters supplies operating current in the sampling mode and supplies no current in the holding mode. First and second rectifiers each serially coupled with a resistor are coupled between a reference voltage and the collectors of the first and second transistors, respectively. A hold capacitor is coupled between the collectors of the transistors.

6 Claims, 2 Drawing Figures

SAMPLE-HOLD PHASE DETECTOR

This invention relates to a sample-and-hold circuit which may be operated as a phase detector and which is particularly advantageous in a television horizontal oscillator phase control circuit.

Television display devices commonly form an image by rapidly scanning a light spot over the surface of a display device to form a lighted raster area. Conventional television provides a high-speed horizontal scanning with a relatively low-speed vertical scanning. The scanning in the vertical and horizontal directions is synchronized by synchronizing signals included with the video signal to be displayed in a composite video signal. The synchronizing signals are extracted from the composite video, and the synchronizing signals thus extracted are used to synchronize the vertical-and horizontal-direction scanning apparatus.

In television systems in which the composite video signals are modulated onto a carrier and broadcast, many of the television receivers are in areas far from the transmitting station, where a weak signal can be expected. Due to the presence of unavoidable thermal noise and to various forms of interference signals occurring in the vicinity of the receiver, it can be expected that the composite video and the synchronizing signals derived therefrom will be intermingled with electrical noise. This electrical noise is manifested as random variation of the desired signal amplitude, and can severely perturb the operation of the display device. Commonly, noisy synchronizing signals cause "rolling" or "tearing" of the image displayed on the raster.

In order to combat the undesirable effects of noise, it is customary to use a horizontal oscillator operating near the intended horizontal scanning rate, and to synchronize the oscillator with the horizontal synchronizing signal in an indirect manner. The indirect synchronization is accomplished by a phase-lock loop (PLL) in which a phase detector compares the output of the horizontal oscillator with the horizontal synchronizing signals and produces a pulsating control signal representative of the frequency and phase difference between the two. The control signal is then filtered and applied to the oscillator in such a manner as to maintain the oscillator in frequency and phase synchronism with the average arrival time of the received synchronizing signals.

Since the PLL is a feedback system, there is an undesired residual phase error between the oscillator signal and the synchronizing signal. High loop gain is desirable in order to minimize this error, but due to imperfections in the loop components has the disadvantage of making the loop more responsive to perturbing noise. This can be offset by reducing the closed-loop bandwidth of the PLL, which may undesirably reduce transient response time. Thus, a compromise between loop gain and bandwidth is necessary.

A sample-and-hold (SH) phase detector is described in U.S. Pat. No. 3,641,258 issued Feb. 8, 1972 in the name of Steven Steckler. The SH detector advantageously maintains the phase detector output signal amplitude during the interval between recurrent synchronizing pulses. Thus, the input to the loop filter of the PLL remains substantially constant during the interval between synchronizing pulses as well as during the sampling interval. This increases the apparent loop gain by the ratio of the non-sample to sample intervals without compromising the weak signal performance of the phase detector. However, the PLL of the aforementioned Steckler patent may have less overall loop gain than desired because the incremental output of the single-ended (SH) phase detector cannot be used directly. To be used effectively the phase detector output signal must be compared with a reference voltage. The reference voltage may contain noise components which adversely affect the operation of the PLL by introducing undesired modulation of the oscillator signal.

SUMMARY OF THE INVENTION

A sample-and-hold circuit adapted to sampling a voltage under control of a gating signal and holding a voltage representative of the sample includes first and second transistors having their emitters coupled together. The bases of the transistors are coupled to the source of voltage to be sampled. A gated current source is coupled to the joined emitters and to the source of gating signals for supplying operating current to the emitters. First and second rectifiers are coupled in series with first and second resistors, respectively, to form first and second series circuits which are coupled between a source of potential and the collectors of the first and second transistors. A charge storage network is coupled between the collectors of the first and second transistors.

DESCRIPTION OF THE INVENTION

Figure 1:
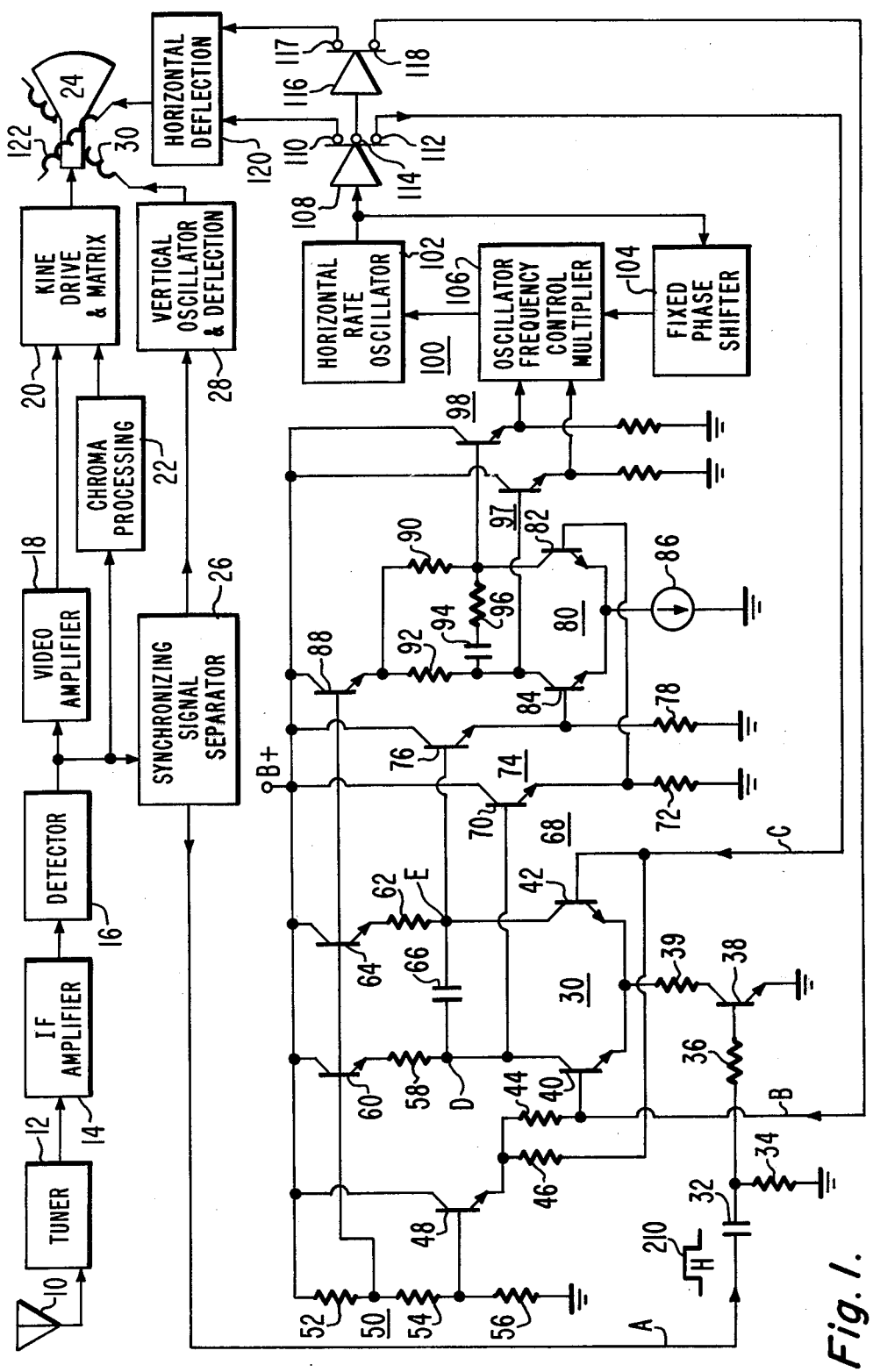
FIG. 1 is a diagram in block and schematic form of a television receiver embodying the invention.

In FIG. 1, an antenna 10 at upper left receives television carrier signals which are coupled to a tuner 12 in which a carrier is selected and downconverted to an intermediate frequency (IF). The intermediate frequency carrier is coupled to an IF amplifier 14 in which it is amplified and applied to a detector 16 in which the composite video modulation is extracted from the carrier. The composite video is applied to a video amplifier 18 and kinescope drive circuit 20. The color-representative portions of the composite video signal are extracted by a chroma processing circuit illustrated as a block 22. The resulting color-representative signals are combined with the luminance signals in the kine driver and matrix 20, and the resultant 3-color signal is applied to the electron gun assembly of a kinescope 24 for display. The composite video from detector 16 is also applied to a synchronizing signal separator 26. Separator 26 extracts vertical synchronizing signals from the composite video and applies them to vertical oscillator and deflection circuits illustrated as a block 28, which produces deflection current in a vertical deflection winding 30 associated with the kinescope. Synchronizing signal separator 26 also produces on a conductor A horizontal synchronizing signals illustrated as 210 of FIG. 2a. The remainder of FIG. 1 illustrates generally a sample-and-hold circuit designated as 30 operated in a PLL with a filter 80 and a controllable oscillator 100. Oscillator 100 produces relatively noise free drive pulses for a horizontal deflection circuit illustrated as a block 120 which produces horizontal deflection current in a horizontal deflection winding 122 associated with kinescope 24.

Separated horizontal synchronizing pulses 210 are applied from conductor A through a capacitor 32, across a resistor 34 and through a resistor 36 to the base of an NPN transistor 38 acting as a gated current source. Transistor 38 has its emitter connected to ground and its collector coupled to the joined emitters of NPN transistors 40 and 42 by a resistor 39. The bases of transistors 40 and 42 are coupled by resistors 44 and 46, respectively, to a source of bias potential at the emitter of an NPN transistor 48 operated as an emitter follower. The base of transistor 48 is coupled to a tap on a voltage divider designated generally as 50 and including resistors 52, 54 and 56 coupled between B+ and ground. The collector of transistor 48 is coupled to B+.

The collector of transistor 40 is connected at a point D with a resistor 58 and through resistor 58 to a voltage appearing at the emitter of an NPN transistor 60 operated as an emitter follower. The base of transistor 60 is coupled to a tap on voltage divider 50 at which a reference voltage appears. Similarly, the collector of transistor 42 is connected at a circuit point E with a resistor 62 and through resistor 62 to the emitter of an emitter-follower-connected NPN transistor 64, the collector of which is connected to B+ and the base of which is connected to the base of transistor 60. A hold capacitor 66 is coupled between circuit points D and E.

Signals representative of the frequency and phase difference between the separated horizontal synchronizing signal 210 and the drive pulses to horizontal deflection circuit 120 are coupled from across capacitor 66 by emitter followers designated generally as 68 and 74. Emitter follower 68 includes an NPN transistor 70 having its base connected to circuit point D and its collector connected to B+, and its emitter coupled to ground by a resistor 72. Emitter follower 74 includes an NPN transistor 76 having its base connected to circuit point E, its collector connected to B+ and its emitter coupled to ground by a resistor 78. Filter 80 includes transistors 82 and 84, the bases of which are coupled to the outputs of emitter followers 68 and 74, respectively, and the combined emitters of which are coupled to ground by a current source 86. The collectors of transistors 82 and 84 are coupled to the emitter of an NPN transistor 88 by resistors 90 and 92, respectively. The series combination of a capacitor 94 and a resistor 96 is coupled between the collectors of transistors 82 and 84 and low-pass filters or averages the signal appearing across capacitor 66.

The oscillator control signal appearing across capacitor 94 is coupled to oscillator 100 by a pair of emitter followers designated generally as 97 and 98. Controllable oscillator 100 includes an oscillator 102 having a natural frequency near the horizontal rate, a fixed phase shifter 104 coupled to the output of oscillator 102 and having an output coupled through a frequency control circuit 106 to oscillator 102 for control of the amplitude of the phase shifted signal reinjected to the oscillator. Controllable oscillator 100 may be of known type such as described in U.S. Pat. No. 4,020,500 issued Apr. 26, 1977 to Leo Harwood. An output is taken from controllable oscillator 100 by means of an amplitude inverter 108 having three outputs 110, 112 and 114. Output 110 is connected to horizontal deflection circuit 120 and output 112 is applied to the base of transistor 42 of SH circuit 30. Output 114 of inverter 108 is applied to the input of a second inverter 116, which inverts the signal and produces at an output 117 for application to horizontal deflection circuit 120 a signal complementary to that at output 110. Inverter 116 also produces at an output 118 for application to the base of transistor 40 an output signal complementary to that at output 112. Horizontal deflection circuit 120 accepts the inputs from outputs 110 and 117 of inverters 108 and 116 and in response provides deflection current in horizontal deflection winding 122, as described.

In operation, immediately preceding the arrival of a horizontal synchronizing signal 210 on conductor A, transistors 38, 40 and 42 are nonconductive. In the absence of conduction by transistors 40 and 42, substantially no current flows through resistors 58 or 62, or through the emitter-base junctions of transistors 60 and 64. Capacitor 66 cannot discharge in either direction through the path extending from circuit point D through resistor 58, the base-emitter junction of transistors 60 and 64 and through resistor 62 to circuit point E, for current flow will reverse-bias the base-emitter junction of either transistor 60 or 64. Thus, the base-emitter junctions of transistors 60 and 64 act as rectifiers. Transistors 70 and 76 present a high impedance at points D and E, and thus any charge on capacitor 66 is stored. However, the voltage across capacitor 66 appears differentially across the bases of transistors 82 and 84 to provide an input voltage representative of the frequency and phase difference which existed previously between synchronizing signal 210 and the output of controllable oscillator 100.

Figure 2:
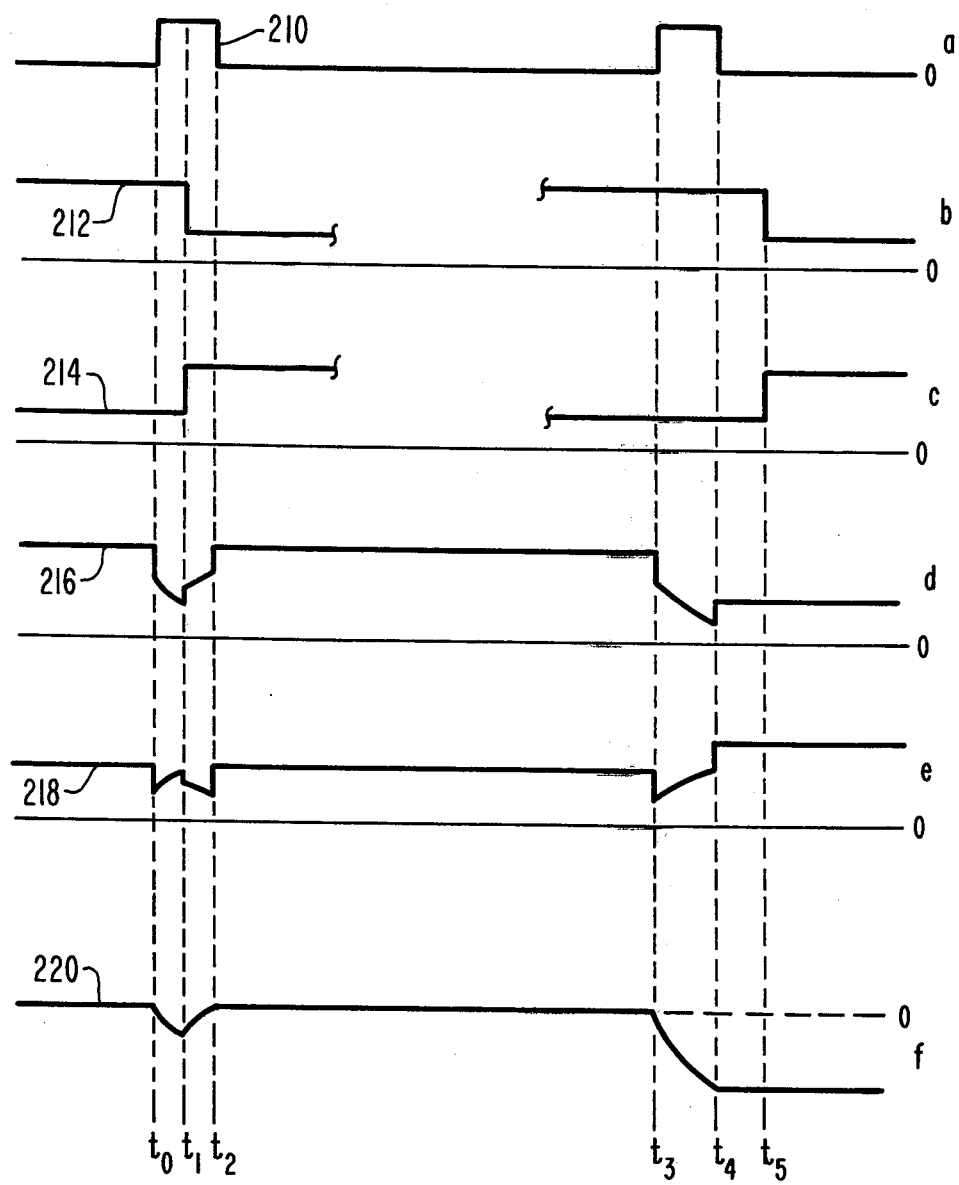
FIG. 2 illustrates amplitude-time voltage waveforms occurring in the arrangement of FIG. 1 during operation under various conditions.

At a time T0 as illustrated in FIG. 2, a horizontal synchronizing signal 210 is applied from conductor A to bias transistor 38 into conduction and provide a current for transistors 40 and 42. At time T0, assuming that the proper in-phase relationship exists between the output of oscillator 100 and the synchronizing signals, the signal applied to the base of transistor 40 over conductor B will be high as illustrated by 212 of FIG. 2b, and the voltage applied over conductor C to the base of transistor 42 will be low as illustrated by waveform 214 of FIG. 2c. With this base drive, transistor 40 will conduct more than transistor 42. The collector current of transistor 40 flows through resistor 58 and through the collector-emitter path of transistor 60, while the collector current of transistor 42 flows through resistor 62 and the collector-emitter path of transistor 64. The initial collector current flow of transistor 40 at time T0 causes the voltage at circuit point D to decrease immediately as illustrated by 216 of FIG. 2d. Capacitor 66 acts as a coupling element by which virtually instantaneous changes in voltage are coupled from circuit point D to circuit point E, and consequently the voltage at circuit point E also decreases sharply by an amount equal to the decrease of circuit point D, as illustrated by waveform 218 of FIG. 2e.

In the first instants after time T0, resistors 58 and 62 are essentially coupled in parallel by capacitor 66, so the excess of the collector current of transistor 40 over that of transistor 42 flows through capacitor 66 and resistor 62, causing capacitor 66 to begin to charge with circuit point D decreasing in voltage or becoming more negative with respect to circuit point E. As time progressed in the interval between T0 and T1, more and more charge accumulates on capacitor 66, and circuit point D becomes progressively less positive with respect to circuit point E and to ground. Similarly, the voltage 218 at circuit point E after the initial decrease at time T0 becomes more positive both with respect to ground and with respect to circuit point D, as illustrated in FIG. 2e. At a time T1 illustrated as occurring at the center of horizontal synchronizing pulse 210, the pulsatory output of horizontal oscillator 100 changes state, as illustrated in FIGS. 2b and 2c, and transistor 42 begins to conduct more heavily than transistor 40. The large collector current flow of transistor 42 flows through resistor 62 and the collector-emitter path of transistor 64, and through the parallel path consisting of capacitor 66, resistor 58 and the collector-emitter path of transistor 60. Due to the accumulated charge and resulting voltage across capacitor 66, the collector current of transistor 42 flows preferentially through the path including resistor 58. This causes capacitor 66 to discharge towards its original voltage as the voltage at circuit point D becomes progressively more positive and the voltage at circuit point E progressively more negative. The sampling period ends and the hold interval begins at time T2 at which horizontal synchronizing pulse 210 ends and operating current for transistors 40 and 42 terminates.

An alternative explanation of the charge and discharge of capacitor 66 is as follows. The emitters of transistors 60 and 64 are at the same potential, and the emitters may be viewed as being coupled together to form a single source of potential. With the emitters of transistors 60 and 64 acting merely as a voltage source, the collector currents of transistors 40 and 42 may be viewed as flowing independently through resistors 58 and 62, respectively. This results in a differential voltage applied to capacitor 66 through the sum of the resistances of resistors 58 and 62. During the first interval T0-T1, point D is connected to an equivalent voltage source that is negative with respect to point E and capacitor 66 charges in a first polarity, and during the second interval T1-T2 point E is connected to an equivalent voltage source that is negative with respect to point D and capacitor 66 discharges back towards its original voltage. Which ever of these equivalent explanations is preferred, the difference voltage between circuit points D and E is represented by voltage waveform 220 of FIG. 2f.

When the transition of the pulsatory voltage produced by oscillator 100 is exactly centered in time relative to synchronizing signal 210, the voltage across capacitor 66 and available for application to filter 80 is the same after the sampling interval as before. It should be noted that as illustrated, waveforms 216 and 218 show a step transient at time T1, resulting from inadequacies of the test instrumentation used in obtaining the waveforms. In the case illustrated for the interval T0-T2 of FIG. 2, no net change in voltage occurred across capacitor 66 as a result of sampling the phase difference between oscillator 100 and synchronizing signals 210. Therefore, no change occurred at the input of filter 80 and the average output remains constant, thereby maintaining constant the amount of sampled and phased-shifted signal applied from phase shifter 104 through oscillator control 106 to oscillator 102.

For the case in which the transition of the output pulse of controllable oscillator 100 is delayed with respect to the center of horizontal synchronizing signal 210, the waveforms in the interval T3-T5 of FIG. 2 apply. At time T3, a pulse 210 turns on transistor 38 and provides current for transistors 40 and 42. Transistor 40 conducts more heavily than transistor 42 by virtue of the greater voltage on conductor B compared with that on conductor C. After the initial transition, the voltage at circuit point D becomes progressively more negative with respect to ground and with respect to circuit point E. Circuit point E, on the other hand, becomes progressively more positive during the entire interval between times T3 and T4. At the time T4 of the end of the sampling interval established by synchronizing pulse 210, circuit point D remains more negative and circuit point E more positive than previously, and the difference voltage 220 coupled to filter 80 is changed in a direction to control the phase of oscillator 100 in a feedback manner to reestablish the desired synchronism.

The described invention samples the signal and provides an output signal representative of the signal being sampled. The output signal is supplied during the interval between sampling periods to the following stage in a differential manner, and rejects common-mode variations of the source being sampled. The output is self-referencing, in that no additional balancing or offsetting circuitry is required to make the output usable.

In a particular embodiment of the invention and for a B+ of +10 volts, the following component values were found to provide suitable operation in an integrated-circuit environment:

| RESISTORS | OHMS |
| --- | --- |
| 34 | 330k |
| 39 | 4.3k |
| 36,54,58,62 | 2k |
| 44,46 | 20k |
| 52 | 13k |
| 56 | 5600 |
| 72,78 | 150k |
| 90,92 | 10k |
| 96 | 190 |
| CAPACITORS | FARADS |
| 32 | 330P |
| 66 | 280P |
| 94 | 10μ |

It will be apparent to those skilled in the art that the function provided by transistors 60 and 64 may be provided instead by diodes coupled between the ends of resistors 58 and 62 and a voltage source. The diodes must be poled to prevent discharge of capacitor 66 in the hold mode of operation. Also, SH circuit 30 may be operated with a single-ended input, so long as the base of transistor 40 or 42 not coupled to the source is coupled to ground. When operated single-ended, the common-mode rejection is lost.

What is claimed is:

1. A sample-and-hold circuit for sampling a voltage during a sampling interval and holding a voltage representative of the sample during a holding interval comprising:

a source of voltage to be sampled;

a source of gating signals which occur concurrently with said sampling interval;

first and second transistors each including emitter, collector, and base, said first and second transistors being coupled together at their emitters and having their bases coupled to the source of voltage to be sampled;

gated current means coupled to said emitters of said first and second transistors and responsive to said gating signals for supplying operating current to said emitters during said sampling interval;

capacitance means coupled between the collectors of said first and second transistors for storing said voltage representative of said sample during said holding interval;

first and second resistors; and first and second rectifier means serially coupled with said first and second resistors, respectively, to form first and second series circuits, said first and second series circuits being coupled between a source of potential and the collectors of said first and second transistors, respectively, said rectifier means being biased for supplying current to said collectors during said sampling interval, wherein said voltage stored by said capacitance means causes one of said rectifier means to be biased for nonconduction during said holding interval so as to prevent the dissipation of said stored voltage through said first and second series circuits.

2. A circuit according to claim 1 wherein said first and second rectifier means comprise first and second semiconductor junctions.

3. A circuit according to claim 2 further comprising third and fourth semiconductor junctions coupled with said first and second semiconductor junctions, respectively, for forming third and fourth transistors, of which said first and second semiconductor junctions form the base-emitter junctions and said third and fourth semiconductor junctions form the collector-base junctions.

4. A circuit according to claim 1 or 3 wherein said gated current means comprises a fifth transistor including a controlled current path and a control electrode, said controlled current path being coupled between said coupled emitters of said first and second transistors and a source of reference potential, and further comprising:

a source of horizontal synchronizing pulses coupled to said control electrode of said fifth transistor for causing a current to flow in said controlled current path.

5. In a television receiver, a circuit for detecting the difference in phase between horizontal synchronizing pulses and pulses produced by an oscillator at substantially the horizontal rate comprising:

first and second transistors each having an emitter, a base, and a collector electrode, said transistors being coupled together at their emitters and having their bases coupled to receive pulses from said oscillator;

gated current means coupled to said emitters of said first and second transistors and responsive to said horizontal synchronizing pulses for supplying current to said emitters during synchronizing pulse intervals during which said phase difference is to be detected;

capacitance means coupled between the collectors of said first and second transistors for storing a voltage representative of said phase difference between successive synchronizing pulse intervals;

first and second resistors; and first and second rectifying junctions serially coupled with said first and second resistors, respectively, to form first and second series circuits, said first and second series circuits being coupled between a source of potential and the collectors of said first and second transistors, respectively, wherein said rectifying junctions are biased to supply current to said collectors during said synchronizing pulse intervals, and said voltage stored by said capacitance means biases one of said rectifying junctions at cutoff between successive synchronizing pulse intervals so as to prevent dissipation of said stored voltage by way of said first and second series circuits.

6. The circuit arrangement of claim 5, further comprising:

a filter circuit having first and second inputs and first and second outputs;

means for coupling said phase difference representative voltage stored by said capacitance means to said first and second inputs of said filter circuit;

means for coupling said filter circuit outputs to said oscillator so as to control the phase and frequency of said oscillator;

wherein said phase detecting circuit, said coupling means, after filter circuit, and said oscillator comprise a phase locked loop which synchronizes the pulses produced by said oscillator to said horizontal synchronizing pulses.

* * * * *

UNITED STATES PATENT AND TRADEMARK OFFICE
CERTIFICATE OF CORRECTION

PATENT NO. : 4,216,396

DATED : August 5, 1980

INVENTOR(S) : Alvin R. Balaban and Steven A. Steckler

It is certified that error appears in the above-identified patent and that said Letters Patent is hereby corrected as shown below:

In the Abstract, line 4 that portion reading "gated circuit source" should read --gated current source--.  In Claim 6, column 8, line 39, that portion reading "after filter" should read --said filter--.

Signed and Sealed this

Eighteenth Day of November 1980

[SEAL]

Attest:

SIDNEY A. DIAMOND

Attesting Officer

Commissioner of Patents and Trademarks